United States Patent [19]

Ulrich

[11] Patent Number: 4,563,375
[45] Date of Patent: Jan. 7, 1986

[54] FLAT BAG FILLED WITH THERMALLY CONDUCTING LIQUID OR PASTE

[75] Inventor: Bohdan Ulrich, Kehrsatz, Switzerland

[73] Assignee: Hasler AG, Bern, Switzerland

[21] Appl. No.: 640,966

[22] Filed: Aug. 15, 1984

[51] Int. Cl.⁴ .............................. B32B 7/04; F28F 7/00
[52] U.S. Cl. ........................................ 428/35; 428/76; 165/46
[58] Field of Search .................... 428/76, 320.2, 321.1, 428/35; 252/70; 128/403; 165/46, 186, 104.33, 104.28; 383/127, 901, 902; 220/3.1

[56] References Cited

U.S. PATENT DOCUMENTS

| 640,534 | 1/1900 | Cheney | 165/46 |
| 3,075,529 | 1/1963 | Young, Jr. | 128/403 |
| 3,545,230 | 12/1970 | Morse | 165/46 |
| 3,586,102 | 6/1971 | Gilles | 165/186 |

OTHER PUBLICATIONS

IBM Disclosure Bulletin, vol. 19, No. 8, Jan. 1977, p. 3127.

Primary Examiner—John E. Kittle
Assistant Examiner—Thomas C. Saitta
Attorney, Agent, or Firm—Horst M. Kasper

[57] ABSTRACT

A flat bag is disclosed which is filled with a thermally conducting paste or liquid. The bag is composed of foils and is sealed and closed on all sides. The foils are of metal such as aluminum and the flat bag is filled only to part of its maximum available volume with a paste or a liquid without the presence of a gas. The bag is subdivided into compartments or pockets by connecting opposing foils along strips.

14 Claims, 2 Drawing Figures

FLAT BAG FILLED WITH THERMALLY CONDUCTING LIQUID OR PASTE

BACKGROUND OF THE INVENTION

1. Field of the Invention

The present invention relates to a flat bag, which is composed of foils and closed on all sides and which is filled with a thermally conducting paste or liquid.

2. Brief Description of the Background of the Invention Including Prior Art

The thinner the intermediate gap space or slot filled with air and disposed between the thermally contacting surfaces of the bodies is, the larger the heat transfer between two solid bodies. It is known to grind the surfaces planar and to polish the surfaces in order to reduce the thermal resistance between two bodies, which are in contact only for a certain time duration. If this is too expensive, then it is further known to fill the slot between the contact surfaces with a thermally conducting paste. This paste reduces the thermal resistance of the respective slots in each case based on its thermal conductivity, which is substantially higher than that of air. Thermally conducting pastes are relatively difficult to handle, since the pastes are highly viscous and behave like an adhesive. Therefore, it was attempted to improve the properties by enclosing the pastes into a bag. For example, a plastic bag is known from U.S. Pat. No. 3,586,102, which serves for the production of thermal bridges between the devices of a conductor plate and a heat dissipating plate.

A plastic bag is known from IBM Disclosure Bulletin, Volume 19, No. 8, January 1977, page 3127, which bag is filled with liquid metal. This bag again serves for the removal of heat from electrical devices to a thermal sink.

Neither thermal conductivity pastes nor bags of the kind taught by the art are suitable for reducing the thermal resistance in vertical slots with a relatively small temperature gradient. Open pastes run out of the slot in the course of time and influence the resistance in an uncontrolled fashion. In contrast, the bags have too large a volume and the plastic of the foils of the bags causes an increase of the overall thermal resistance, which cannot be neglected.

SUMMARY OF THE INVENTION

1. Purposes of the Invention

It is an object of the invention to provide a medium, which reduces the thermal resistance between two surfaces.

It is another object of the invention to provide a device which reduces the thermal resistance between two about vertically disposed surfaces.

It is a further object of the present invention to provide a filler medium device, which is stable over extensive time periods, which can be easily handled and is effective between thin and large surface areas.

These and other objects and advantages of the present invention will become evident from the description which follows.

2. Brief Description of the Invention

The present invention provides a flat bag filled with a fluid of good thermal conductivity which comprises a bag made of metal foil and separated into compartments by line connection areas between opposite foils of the bag, a filling of a fluid of good thermal conductivity in the bag without gas enclosure, which filling occupies only a small percentage of the maximum filling volume of the bag.

The fluid can be a liquid, a semiliquid, or a paste. The metal foil can be an aluminum foil or a foil containing copper. The compartments of the bag can be pockets connected to each other. The compartments of the bag can also be closed pockets. The compartments can be surrounded by a line where the tangents about at the endpoints of the line are in different directions resulting in a V- or U-shape of the compartment. The compartments can have a width between the line connection areas which is from about 2 to 4 times the thickness of the compartments.

The compartments can be elongated substantially in a vertical direction relative to the longer direction of the bag. The compartments can be formed to provide a fluid supporting container for a bag of elongated shape disposed vertically with its elongated direction.

There is also provided a method for enhanced thermal balancing between two rigid substantially planar surface bodies which comprises filling a flat bag subdivided into compartments with a good thermally conducting fluid, sealing the fluid in the flat bag such that no air is left in the bag and that the fluid fills only a part of the total possible volume available in the bag, and disposing a flat bag between the two surfaces where the flat bag is larger than at least one of the two surfaces, where at least on one side of the bag such a region of the bag remains freely disposed, which is capable to receive substantially all the fluid, and where the surfaces to be contacted are separated only by the blank foils for at least one spot.

The surfaces to be thermally balanced can be disposed in a substantially vertical position. The compartments can be furnished as pockets. The bag can be disposed such between the surfaces that its pockets form containers closed at the bottom for holding fluid.

The fluids are generally viscous and have a high thermal conductivity. Preferred fluids are pastes comprising suspensions of inorganic oxides such as silicone containing, silicone free or aqueous suspensions. The suspended materials can be oxides such as silica, alumina or beryllium oxide. Examples for such pastes are the Paste P12 of Wacker Siltronic Corporation, New York, N.Y. or DC314 of Dow Corning Corporation, Midland, Mich. In general, a temperature range of from about room temperature to about 70 degrees centigrade is of interest as occurring at the warmer surface to be cooled.

The liquid conductivity fluid filled bags according to the invention provide the advantage that they can be about universally employed, that they do not require messy handling of viscous and adhesive liquids or pastes, and that both the metal surface of the bags and the fluid contained in the bags provide high thermal transfer. While the less expensive silicone containing thermal conductivity pastes can generally not be used for electronic purposes, the present invention provides an enclosure, which allows to use silicone containing thermal conductivity pastes in electronic apparatus in an enclosed form.

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

In the accompanying drawing, in which is shown one of the various possible embodiments of the present invention.

DESCRIPTION OF INVENTION AND PREFERRED EMBODIMENT

In accordance with the present invention there is provided a flat bag 11 closed on all sides, which is composed of foils 14, 15, and which is filled with a thermally conducting paste 18 or with a liquid. The foils are metal foils 14, 15 and preferably aluminum foils. The flat bag 11 is filled with paste 18 or liquid only to a small part of the possible maximum volume, and no gases or other materials are enclosed in the bag. The flat bag 11 is subdivided into compartments by joining its foils along strips into pockets 28.

The pockets 28 can be connected to each other or alternatively can be closed in themselves and they are preferably of a U- or V-shape.

The flat bag 11 can be employed as a filler material or filler device for filling the volume of a slot between two substantially planar surfaces of two rigid bodies. The bag disposed between two surfaces to be thermally contacted can be larger than at least one of the surfaces such that at least at one location of the bag 11 an area of the bag 11 remains free, which is capable to accept the total amount of paste 18 or filler material inserted. The bag 11 can be clamped to such an extent between the surfaces to be contacted that the surfaces are separated only by the bare foils 14, 15.

The surfaces to be contacted can be disposed substantially vertical and the bag can be inserted such that its pockets are closed at the bottom. Preferably the bottom of the pockets occurs near a middle axis of the flat bag.

Figure 1:
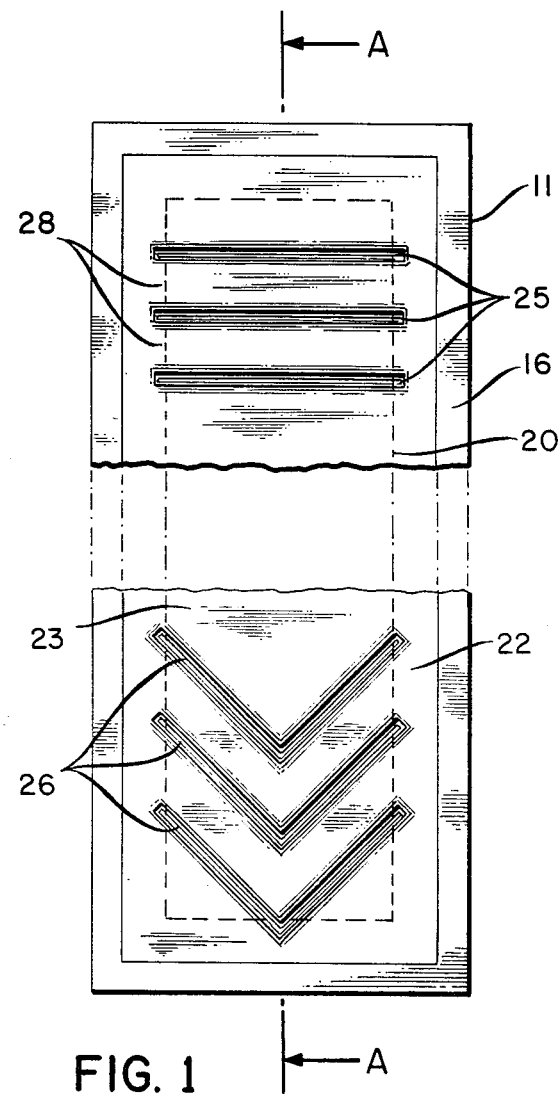
FIG. 1 is a schematic plan view of an elongated thermal transfer bag according to the invention.
Figure 2:
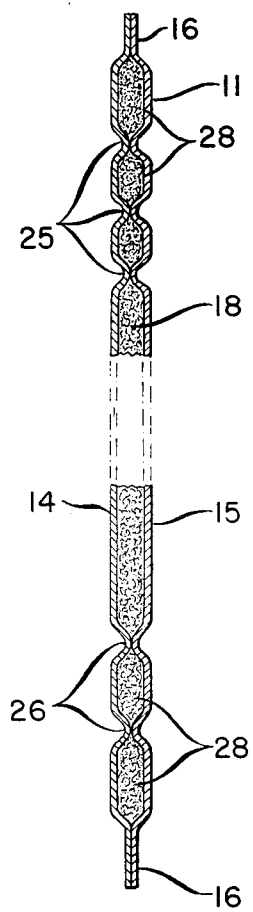
FIG. 2 is a schematic cross-sectional view of the thermal transfer bag of FIG. 1.

FIG. 1 shows a plan view and FIG. 2 illustrates a section along the line A—A of the flat bag 11 in FIG. 1. The bag 11 can be formed by two foils 14, 15 by adhesive gluing, by welding or by soldering. The welding edge is designated as 16 and it hermetically seals the bag all around.

The foils 14, 15 are made of a good thermally conducting material, in particular of metal such as for example aluminum. They are relatively thin (for example less than about 0.2 millimeters thick and preferably less than about 0.1 millimeters) thick and they are adapted to follow the shape of the surface of the body they are contacting. A good thermally conducting paste 18 is contained in the interior of the bag 11.

A limit 20 of a region is shown as a dashed line. The inner region relative to this limit serves for filling the slot between two rigid bodies for the purpose of an improved heat exchange between the two bodies. The area 22 between the limit 20 and the welding edge 16 is not to be allowed to be disposed in the slot, but has to leave space for expansion. Its maximum blow up volume is dimensioned such that it can accept the complete thermal conducting plate 18 contained in the bag 11.

The bags 11 are preferably employed in electronic constructions and racks with liquid cooling, as are known for example from Swiss patent application No. 3 683/82-0. These racks and constructions have the purpose to provide a long term stable and trouble free thermal conduct between exchangeable inserts containing the electronic circuits and generating excess heat and the cooling system tubes inside of the rack for removing the heat dissipated in the rack.

The respective bag 11 in each case is squeezed between the rear wall of the insert and the tubes upon sliding in of the insert into the electronic rack. The paste 18, which is initially disposed in the inner region 23 of the bag 11, flows in part into to outer region 22 of the bag 11. The foils 14, 15 follow the contours of the tubes and of the rear wall and the paste fills the unevenness of the slot. The paste 18 squeezed out remains in the outer region 22 of the bag 11. The final state is reached if only the blank foils are interposed at least at one location between the tubes and the rear wall and the paste 18 is fully squeezed out.

Advantageously, the bag 11 is provided with cross weldings or adhesive contacts 25, 26 in its inner region 23. These cross-weldings 25, 26 connect the two foils 14, 15 like along strips and form compartments or pockets 28, which are connected to each other by relatively narrow passages or which are not connected at all.

The cross-weldings can be along straight lines 25 and preferably they are bent like a V (compare 26) or a U. In case the bag 11 is employed in a vertical position, then the U- or V-shape prevents effectively the running out of the paste downwardly if the tip or convex side of the lines is directed downwardly. For this reason, also a thermally conducting material of a lower viscosity such as for example a liquid can be employed in the bag 11 instead of a thermally conducting paste 18. A liquid is associated with the advantage of better handling and quicker adaptation to the slot to be fitted and filled with the bag 11. In addition a liquid runs quickly and fast back into its starting position, that is into the middle region 23, if for example an electronic insertion in the described electronic rack has to be changed. A paste has to be pressed back in this case into the middle region by another working process.

If the bag 11 is provided with closed pockets 28, then each of these pockets has to be provided with a lower region, which belongs to the inner region 23 of the bag and at least a second lower region, which belongs to the outer region 22 of the bag 11. Here the second lower region has to be capable to receive in each case the full amount of paste 18 or liquid contained in the respective pocket 28. Closed pockets 28 have the advantage that in case of a leak in each case only one pocket and not the whole bag 11 is concerned.

It is important for the capability of being used that the bag 11 contains exclusively paste or liquid 18. Therefore, it should not include a gas such as air, which could produce interfering bubbles. Therefore, the bag 11 is to be evacuated before or the volume of the paste or liquid 18 has to be small compared with the maximum volume capability of the bag 11.

The outer region 22 is not a sharply defined area. It can be formed arbitrarily and can be placed there, where it fulfills best its function to accept excess paste or liquid 18. In particular, it can be disposed at one of the longitudinal sides of the bag.

It will be understood that each of the elements described above, or two or more together, may also find a useful application in other types of heat dissipation system configurations and heat sinking processing procedures differing from the types described above.

While the invention has been illustrated and described as embodied in the context of a flat bag filled with thermally conducting paste or liquid, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

I claim:

1. A flat bag filled with a fluid of good thermal conductivity comprising
    a bag made of metal foil and separated into compartments by line connection areas between opposite foils of the bag;
    a filling of a fluid of good thermal conductivity in the bag without gas enclosure, which filling occupies only a small percentage of the maximum filling volume of the bag.

2. The flat bag filled with a fluid of good thermal conductivity according to claim 1 wherein the fluid is a liquid.

3. The flat bag filled with a fluid of good thermal conductivity according to claim 1 wherein the fluid is a paste.

4. The flat bag filled with a fluid of good thermal conductivity according to claim 1 wherein the metal foil is an aluminum foil.

5. The flat bag filled with a fluid of good thermal conductivity according to claim 1 wherein the metal foil is a copper containing foil.

6. The flat bag filled with a fluid of good thermal conductivity according to claim 1 wherein the compartments of the bag are pockets connected to each other.

7. The flat bag filled with a fluid of good thermal conductivity according to claim 1 wherein the compartments of the bag are closed pockets.

8. The flat bag filled with a fluid of good thermal conductivity according to claim 1 wherein the compartments are surrounded by a line where the tangents about at the endpoints of the line are in different directions resulting in a V- or U-shape of the compartment.

9. The flat bag filled with a fluid of good thermal conductivity according to claim 1 wherein the compartments have a width between the line connection areas which is from about 2 to 4 times the thickness of the compartments.

10. The flat bag filled with a fluid of good thermal conductivity according to claim 1 wherein the compartments are elongated substantially in a vertical direction to the longer direction of the bag.

11. The flat bag filled with a fluid of good thermal conductivity according to claim 1 wherein compartments are formed to provide a fluid supporting container for a bag of elongated shape disposed vertically with its elongated direction.

12. A method for enhanced thermal balancing between two rigid substantially planar surface bodies comprising filling a flat bag made of metal foil subdivided into compartments with a good thermally conducting fluid;
    sealing the fluid in the flat bag such that no air is left in the bag and that the fluid fills only a part of the total possible volume available in the bag; and
    disposing a flat bag between the two surfaces where the flat bag is larger than at least one of the two surfaces, where at least on one side of the bag such a region of the bag remains freely disposed, which is capable to receive substantially all the fluid, and where at least at one spot the surfaces to be contacted are separated only by the by the blank foils.

13. A method for enhanced thermal balancing between two rigid substantially planar surface bodies according to claim 12 further comprising
    disposing the surfaces to be thermally balanced in a substantially vertical position.

14. A method for enhanced thermal balancing between two rigid substantially planar surface bodies according to claim 12 further comprising
    providing the compartments as pockets; and
    disposing the bag such between the surfaces that its pockets form containers closed at the bottom for holding fluid.

* * * * *

UNITED STATES PATENT AND TRADEMARK OFFICE
CERTIFICATE OF CORRECTION

PATENT NO. :   4,563,375
DATED      :   January 7, 1986
INVENTOR(S) :  Bohdan Ulrich It is certified that error appears in the above-identified patent and that said Letters Patent is hereby corrected as shown below:

after the filing date insert

Related U.S. Application Data

(60)   Continuation in part of PCT-Application November 25, 1983
       (PCT/CH83/00131)

(30)   Foreign Application Priority Data
       December 16, 1982  Switzerland  (CH 7325/82-5)

Signed and Sealed this

Twenty-eighth Day of October, 1986

[SEAL]

*Attest:*

DONALD J. QUIGG

*Attesting Officer*   *Commissioner of Patents and Trademarks*